United States Patent
Igura

(10) Patent No.: US 9,673,780 B2
(45) Date of Patent: Jun. 6, 2017

(54) MULTI-STAGE FILTER PROCESSING DEVICE AND METHOD

(71) Applicant: NEC CORPORATION, Minato-ku, Tokyo (JP)

(72) Inventor: Hiroyuki Igura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 263 days.

(21) Appl. No.: 14/398,237

(22) PCT Filed: Dec. 19, 2012

(86) PCT No.: PCT/JP2012/008113
§ 371 (c)(1),
(2) Date: Oct. 31, 2014

(87) PCT Pub. No.: WO2013/183096
PCT Pub. Date: Dec. 12, 2013

(65) Prior Publication Data
US 2015/0127696 A1    May 7, 2015

(30) Foreign Application Priority Data
Jun. 8, 2012 (JP) ................................ 2012-131270

(51) Int. Cl.
*H03H 17/04* (2006.01)
*H03H 9/46* (2006.01)
(52) U.S. Cl.
CPC .............. *H03H 9/46* (2013.01); *H03H 17/04* (2013.01); *H03H 17/045* (2013.01); *H03H 2220/04* (2013.01)
(58) Field of Classification Search
CPC .......................... H03H 17/045; H03H 17/0664
(Continued)

(56) References Cited

U.S. PATENT DOCUMENTS 5,157,395 A * 10/1992 Del Signore ...... H03H 17/0664
341/143
6,470,365 B1 * 10/2002 Rahman ............. H03H 17/0664
708/313

(Continued)

FOREIGN PATENT DOCUMENTS

JP     63-152212 A    6/1988
JP     2000-269785 A  9/2000

(Continued)

OTHER PUBLICATIONS

International Search Report for PCT/JP2012/008113 dated Apr. 2, 2013 [PCT/ISA/210].

*Primary Examiner* — Chuong D Ngo
(74) *Attorney, Agent, or Firm* — Sughrue Mion, PLLC

(57) ABSTRACT

The present invention addresses the problem of reducing a circuit scale without causing a reduction in processing efficiency. This multi-stage filter processing method measures, at each stage, either the number of input data or the number of intermediate data that is generated by filter calculation processing during the stages before the final stage is reached. Coefficient data regulating for each stage the number of data sufficient to perform the filter calculation processing is held. Input data or the intermediate data that is generated in a current stage is held in a memory until the number of data reaches the number of data sufficient to perform the filter calculation processing in the current stage, on the basis of the coefficient data. When the number of data has reached, the filter calculation processing for the current stage is performed on the input data or the intermediate data that was held.

6 Claims, 13 Drawing Sheets

(58) Field of Classification Search
USPC .......................................................... 708/313
See application file for complete search history.

(56) References Cited

U.S. PATENT DOCUMENTS

| | | | | |
|---|---|---|---|---|
| 8,380,772 | B2* | 2/2013 | Huang | ............... H03H 17/0223 |
| | | | | 708/313 |
| 8,924,450 | B2* | 12/2014 | Huang | ............... H03H 17/0292 |
| | | | | 708/313 |
| 2006/0049969 | A1* | 3/2006 | Lee | ................... H03H 17/0664 |
| | | | | 341/118 |
| 2009/0030961 | A1 | 1/2009 | Matsuyama et al. | |

FOREIGN PATENT DOCUMENTS

| | | |
|---|---|---|
| JP | 2005-128174 A | 5/2005 |
| JP | 2005-149009 A | 6/2005 |
| JP | 2005-318204 A | 11/2005 |
| JP | 2006-260411 A | 9/2006 |
| JP | 2007-67646 A | 3/2007 |
| JP | 2009-33371 A | 2/2009 |

* cited by examiner

| | | | | | | | | | | |
|---|---|---|---|---|---|---|---|---|---|---|
| 0, | 1, | 2, | 3, | 4, | 5, | 6, | 7, | 8, | 9, 10, 11 |
| 2, | 3, | 4, | 5, | 6, | 7, | 8, | 9, 10, 11, 12, 13 |
| 4, | 5, | 6, | 7, | 8, | 9, 10, 11, 12, 13, 14, 15 |
| 6, | 7, | 8, | 9, 10, 11, 12, 13, 14, 15, 0, | 1 |
| 8, | 9, 10, 11, 12, 13, 14, 15, 0, | 1, | 2, | 3 |
| 10, 11, 12, 13, 14, 15, 1, | 2, | 3, | 4, | 5, | 6 |
| 12, 13, 14, 15, 0, | 1, | 2, | 3, | 4, | 5, | 6, | 7 |
| 14, 15, 0, | 1, | 2, | 3, | 4, | 5, | 6, | 7, | 8, | 9 |

MULTI-STAGE FILTER PROCESSING DEVICE AND METHOD

CROSS REFERENCE TO RELATED APPLICATIONS

This application is a National Stage of International Application No. PCT/JP2012/008113, filed on Dec. 19, 2012, which claims priority from Japanese Patent Application No. 2012-131270, filed on Jun. 8, 2012, the contents of all of which are incorporated herein by reference in their entirety.

TECHNICAL FIELD

The present invention relates to a multi-stage filter processing device which performs filter calculation processing on input data to generate output data, and a method thereof.

BACKGROUND ART

In a radio signal processing, a filtering processing is used for eliminating unwanted components included in signals having an interference potential, spurious, or the like. Although circuits performing the filtering processing include analog filter circuits using analog circuits and digital filter circuits using digital circuits, in recent years, use of the digital filter circuits has become frequent. This is because digital circuits make it possible for the filtering processing to be performed with a high degree of accuracy and at a low cost.

There exists a digital rate conversion filter as a type of digital filter. The digital rate conversion filter adjusts a sampling rate such as a digitized intermediate frequency signal (IF signal) and a baseband signal, and at the same time, is used for the purposes of eliminating spurious signals, preventing aliasing or the like. A decimation filter is used for decreasing the sampling rate so that it is less than that parent signals. An interpolation filter is used for increasing the sampling rate so that it is more than that of parent signals.

Like the above digital rate conversion filter, configurations connecting FIR (Finite Impulse Response) in series filters and multiple-stage are much used when, for example, a rate ratio of input data and output data is high.

For instance, Patent Literature 1 discloses a multi-stage filter processing device that includes 1/24 of a decimation filter composed of 1/12 of a decimation filter in combination with 1/2 of a decimation filter. Further, Patent Literature 2 discloses another multi-stage filter processing device that includes 1/64 of a decimation filter composed of 1/16 of a decimation filter in combination with 1/4 of a decimation filter.

Furthermore, Patent Literature 3 to 6 disclose multi-stage filter processing devices.

CITATION LIST

Patent Literature

Patent Literature 1: Japanese Unexamined Patent Application Publication No. 2000-269785 (refer to FIG. 8, for example)
Patent Literature 2: Japanese Unexamined Patent Application Publication No. 2005-318204 (refer to FIG. 3, for example)
Patent Literature 3: Japanese Unexamined Patent Application Publication No. 2007-67646
Patent Literature 4: Japanese Unexamined Patent Application Publication No. 2006-260411
Patent Literature 5: Japanese Unexamined Patent Application Publication No. 2005-149009
Patent Literature 6: Japanese Unexamined Patent Application Publication No. 2005-128174

SUMMARY OF INVENTION

Technical Problem

FIG. 14 shows a first exemplary implementation of a common multi-stage filter processing device. In this implementation, 1/16 of a decimation filter is composed of a plurality of (three) FIR filter circuits 101, 102, and 103 which are connected in series and perform the filter calculation processing.

FIG. 15 shows a second exemplary implementation of a common multi-stage filter processing device. FIG. 16 shows a processing flow of the exemplary implementation of FIG. 15. In this implementation, 1/16 of a decimation filter is composed of one FIR filter circuit 111 which repeats, in regard to one input data, performing of the filter calculation processing. That is to say, in the filter calculation processing corresponding to any stage (for example, stage zero), a local memory 112 stores calculation results of an operation on the input data for a certain period of time by the FIR filter circuit 111. Then, in the filter calculation processing corresponding to the next stage (for example, stage one), the FIR filter circuit 111 performs the filter calculation processing on the calculation results of a previous stage stored in the local memory 112.

In the technique to connect the FIR filter circuits in series as shown in FIG. 14, there is a merit in decreasing latency because data processing can be continuously performed, but there is a demerit in decreasing latency because the size of a calculation circuit increases. Further, when a multi-stage decimation filter is used, a data rate of a later stage is lower than that of former stage. This leads to a decrease in a performance rate of a calculation circuit in the latter stage. As a result, there is a problem that calculation efficiency decreases.

Furthermore, in the technique to perform the filter processes repeatedly by one circuit as shown in FIGS. 15 and 16, there is a merit that the size of circuits decreases but demerits that latency increases, there is a need for a local memory 112 having a certain memory amount, and the like.

Therefore, an exemplary object of the present invention is to downsize a circuit of a multi-stage filter processing device without decreasing processing efficiency.

Solution to Problem

A first exemplary embodiment of the invention is a multi-stage filter processing device that performs filter calculation processing composed of a plurality of stages on input data to generate output data, the multi-stage filter processing device including:
a filter calculation unit that performs the filter calculation processing for each stage;
a processing data holding unit that holds the input data or intermediate data generated by the filter calculation unit during the stages before a final stage is reached;

a measurement circuit of number of data that measures, at each of the stages, a number of data of the input data or the intermediate data;

a coefficient data holding unit that holds a coefficient data regulating a number of data sufficient to perform the filter calculation for each of the stages; and a stage switching control unit that controls switching of the stages in the filter calculation processing, the stage switching control unit making the processing data holding unit hold the input data or the intermediate data generated in a current stage until the number of data reaches a data quantity sufficient to perform the filter calculation processing in the current stage on the basis of the coefficient data, inputting all of the input data or all of the intermediate data held by the processing data holding unit to the filter calculation unit when the number of data reaches the data quantity sufficient to perform the filter calculation processing; and making the filter calculation unit perform the filter calculation processing of the current stage.

A second exemplary embodiment of the invention is a multi-stage filter processing method that performs filter calculation processing composed of a plurality of stages on input data to generate output data, the multi-stage filter processing method including steps of:

measuring, at each of the stages, a number of data of the input data or intermediate data generated by the filter calculation unit during the stages before a final stage is reached;

reading a coefficient data regulating a number of data sufficient to perform the filter calculation for each of the stages;

holding the input data or the intermediate data generated in a current stage until the number of data reaches a data quantity sufficient to perform the filter calculation processing in the current stage on the basis of the coefficient data; and performing the filter calculation processing of the current stage for all of the input data or all of the intermediate data when the number of data reaches the data quantity sufficient to perform the filter calculation processing.

Advantageous Effects of Invention

According to the present invention, it is possible to downsize a circuit of a multi-stage filter processing device without decreasing processing efficiency

DESCRIPTION OF EMBODIMENTS

First Exemplary Embodiment

Figure 1:
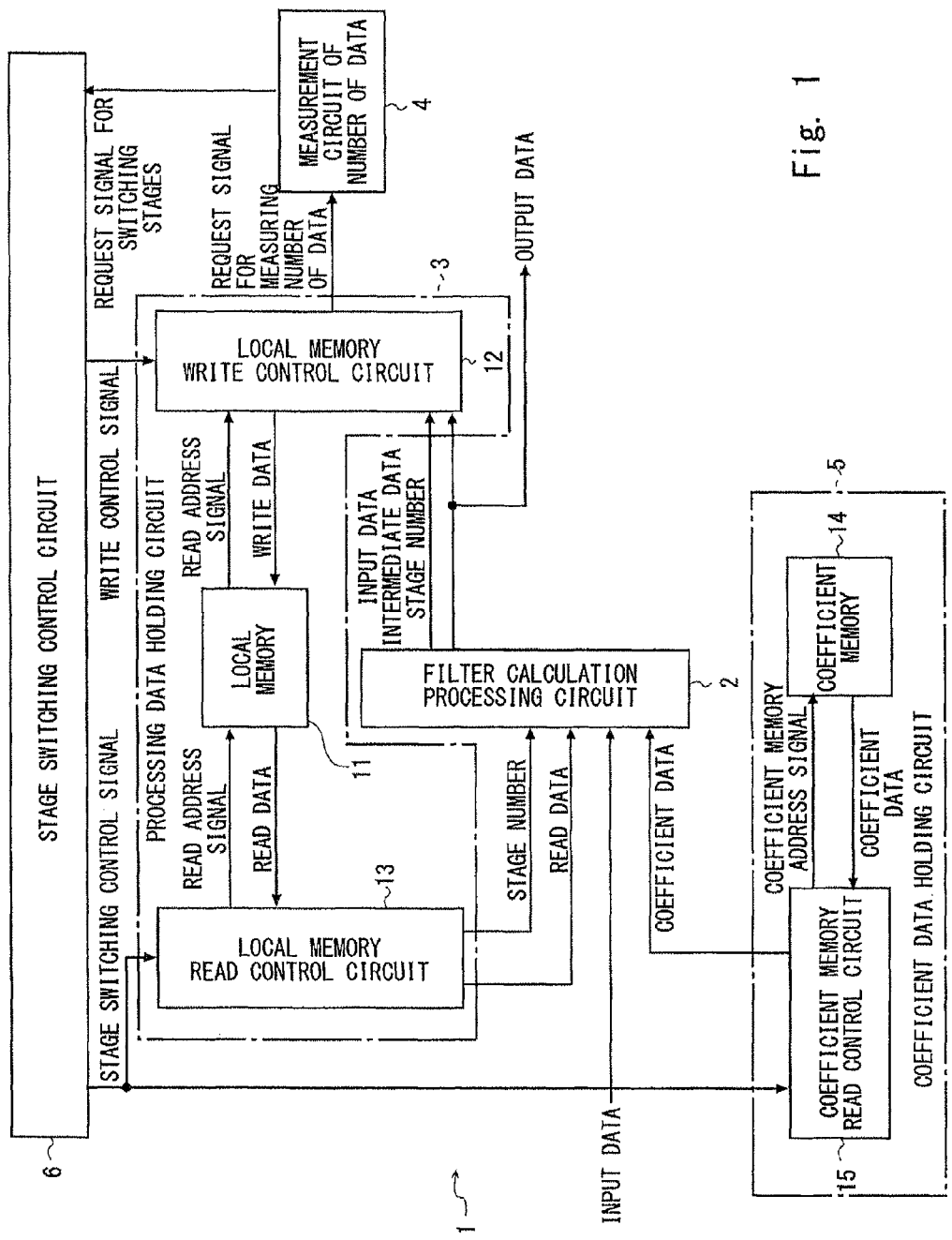
FIG. 1 illustrates an example of a configuration of a multi-stage filter processing device according to a first exemplary embodiment of the present invention.

Hereinafter exemplary embodiments are explained with reference to figures. FIG. 1 shows a configuration of a multi-stage filter processing device 1 according to the present exemplary embodiment. The multi-stage filter processing device 1 performs multi-stage filter calculation processing composed of a plurality of stages on input data to generate output data. The multi-stage filter processing device 1 includes a filter calculation processing circuit 2, a processing data holding circuit 3, a measurement circuit of number of data 4, a coefficient data holding circuit 5, and a stage switching control circuit 6.

The filter calculation processing circuit 2 performs the filter calculation processing at each of the stages. The filter calculation processing circuit 2 receives input data from outside, reads data from the processing data holding circuit 3, a stage number of the read data and coefficient data from the coefficient data holding circuit 5, and outputs the input data, intermediate data, the stage number and output data. The input data is a data before the filter calculation processing is performed by the filter calculation processing circuit 2. The intermediate data is a data generated by the filter calculation processing at each of the stages before the final stage. The output data is a data generated by the filter calculation processing at the final stage.

The processing data holding circuit 3 holds the input data or the intermediate data. The processing data holding circuit 3 of the present exemplary embodiment includes a local memory 11, a local memory write control circuit 12 and a local memory read control circuit 13. The local memory 11 stores the input data or the intermediate data. The local memory write control circuit 12 generates, for each of the stages, an address signal that specifies a storage area of the local memory 11 cyclically in a given cycle and stores the input data or the intermediate data in the local memory 11 in accordance with the address signal. The local memory read control circuit 13 reads the input data or the intermediate data that is stored in the storage area corresponding to the address signal of a current stage, and outputs the read data to the filter calculation processing circuit 2.

The measurement circuit of number of data 4 measures, at each of the stages, either the number of the input data or the intermediate data. The measurement circuit of number of data 4 of the present exemplary embodiment determines if the number of the input data or the intermediate data reaches the number of data sufficient to perform the filter calculation processing for the current stage depending on a request signal for measuring the number of data supplied from the processing data holding circuit 3, and outputs a request signal for switching stages to the stage switching control circuit 6 when the number is sufficient.

The coefficient data holding circuit 5 holds a coefficient data regulating the number of data sufficient to perform the filter calculation processing for each of the stages (hereinafter, abbreviated as "the regulated number of data"). The coefficient data holding circuit 5 of the present exemplary embodiment includes a coefficient memory 14 that stores the coefficient data and a coefficient memory read control circuit 15 that reads the coefficient data corresponding to the current stage to output the filter calculation processing circuit 2.

The stage switching control circuit 6 switches the stages of the filter calculation processing performed by the filter calculation processing circuit 2. The stage switching control circuit 6 makes the processing data holding circuit 3 hold the input data or the intermediate data until the number of data measured by the measurement circuit of number of data 4 reaches the regulated number of data and input the held input data or intermediate data to the filter calculation processing circuit 2 when the number of data reaches the regulated number of data for the current stage. Then the stage switching control circuit 6 makes the filter calculation processing circuit 2 perform the filter calculation processing for the current stage.

First, the input data supplied from outside is input to the local memory write control circuit 12 through the filter calculation processing circuit 2 and written into the local memory 11. At this time, the input data is written as input data for the stage zero.

After that time, the input data for the stage zero is read by the local memory read control circuit 13 and output to the filter calculation processing circuit 2. At the same time, the coefficient memory read control circuit 15 supplies the filter calculation processing circuit 2 with a coefficient data for the stage zero read from the coefficient memory 14. The filter calculation processing circuit 2 performs a product-sum operation for the input data and the coefficient data for the stage zero as the filter processing of the stage zero and stores the calculation result in an inner resistor.

In the stage zero, the final result obtained by repeating the product-sum operation for a predetermined number of times is input to the local memory write control circuit 12 as the intermediate data to be a subject for the filter calculation processing of the stage one and written into the local memory 11. At this time, the intermediate data for the stage one is cyclically written into another address range different from that of the input data of the stage zero.

After that, the filter calculation processing of the stage one is performed in the same way as that of the stage zero, and then the final result of the product-sum operation is written into the local memory 11 as the intermediate data of the stage two.

The foregoing processing is performed for each of the stages, and then the final result of the filter calculation processing is output to the outside of the multi-stage filter processing device 1 as the output data.

The filter processing of the stage zero is performed at a time when the input data sufficient to perform the processing is stored in the local memory 11; that is, at a time when the number of the input data reaches the regulated number of data for the stage zero. The measurement circuit of number of data 4 counts the number of data and informs the stage switching control circuit 6 of the state when the number of data reaches the regulated number of data. In a way similar to this, the filter processing of the stage one is performed at a time when the intermediate data sufficient to perform the processing is stored in the local memory 11. The processing for subsequent stages is carried out in the same way.

According to the above described configuration, the filter processing of each of the stages can be performed at the most appropriate timing by shared calculation circuits and a small memory. Therefore, processing efficiency can be increased and circuit size can be reduced.

Figure 2:
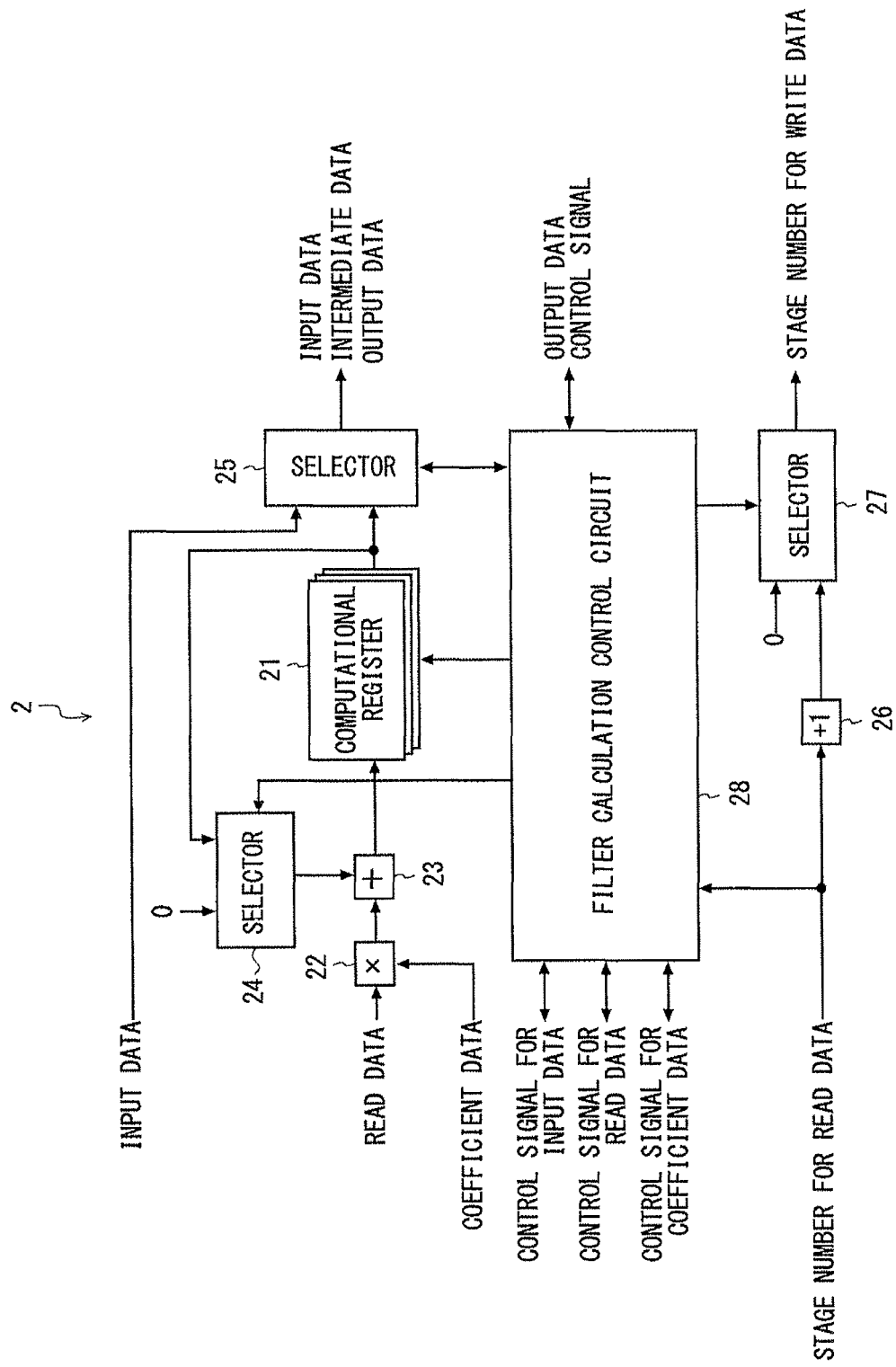
FIG. 2 illustrates an example of a concrete configuration of a filter calculation processing circuit of the multi-stage filter processing device according to the first exemplary embodiment.

FIG. 2 shows an example of a concrete configuration of the filter calculation processing circuit 2. The filter calculation processing circuit 2 of the present exemplary embodiment includes computational registers 21, a multiplier 22, an accumulator 23, selectors 24, 25 and 27, an incrementer 26, a filter calculation control circuit 28, and the like.

A number of the computational registers 21 which corresponds to the number of the stages of multi-stage filter processing are prepared. The computational registers 21 which are subject to writing and reading are selected by the filter calculation control circuit 28.

The multiplier 22 multiplies the read data and the coefficient data, and then the accumulator 23 add zero or a value held by the computational register 21 corresponding to the current stage. The computational register 21 stores the result of the product-sum operation. In this way, the read data input in series and the coefficient data are sequentially stored in the computational register 21 and these values become a calculation result of a FIR filter operation.

The calculation result of the FIR filter operation and the input data are mediated and selected by the selector 25 so as to be output as the input data, the intermediate data or the output data. At this time, a stage number for write data output from the selector 27 is set to zero when the input data is output and set to a value obtained by the addition of one to the current stage number when the calculation result of the FIR filter operation (the intermediate data or the output data) is output.

Figure 3:
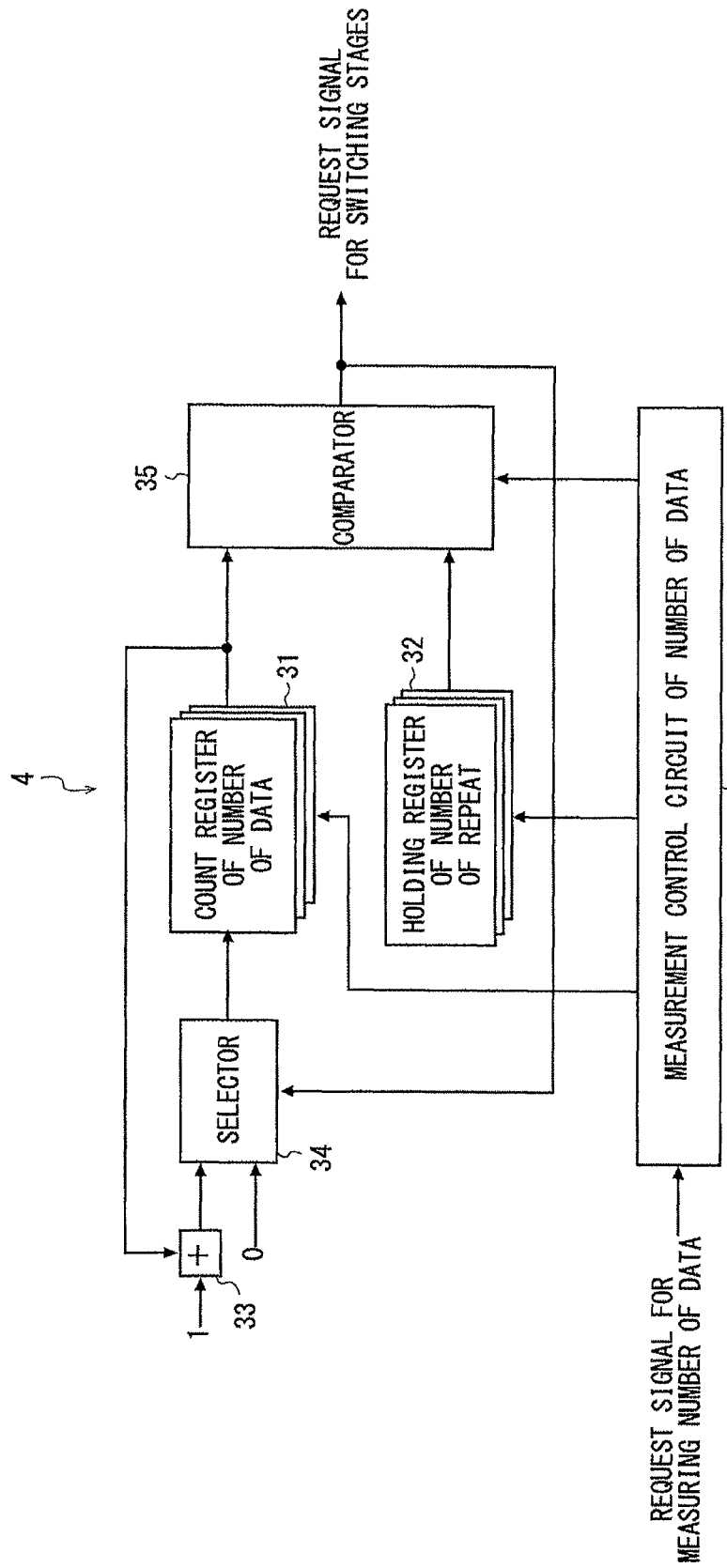
FIG. 3 illustrates an example of a concrete configuration of a measurement circuit of number of data of the multi-stage filter processing device according to the first exemplary embodiment.

FIG. 3 shows an example of a concrete configuration of the measurement circuit of number of data 4. The measurement circuit of number of data 4 includes count registers of number of data 31, holding registers of number of repeat 32, a comparator 35, an accumulator 33, a selector 34, a measurement control circuit of number of data 36, and the like.

A number of the count registers of number of data 31 and a number of the holding registers of number of repeat 32 respectively corresponding to the number of the stages of multi-stage filter processing are prepared. The registers 31 and 32 which are subject to writing and reading are selected by the measurement control circuit of number of data 36.

Upon an instruction being given for counting up the number of data by the request signal for measuring the number of data, one is added to a value held by the count register of number of data 31 corresponding to the current stage and then the added value is written back to the count register of number of data 31.

Each of the holding registers of number of repeat 32 stores the number of data (the regulated number of data) to perform the filter calculation processing specified for each of the stages. The comparator 35 compares the value of the count register of number of data 31 corresponding to the current stage and the value of the holding register of number of repeat 32 and outputs the request signal for switching stages when the result indicates that these values are in accord.

Figure 4:
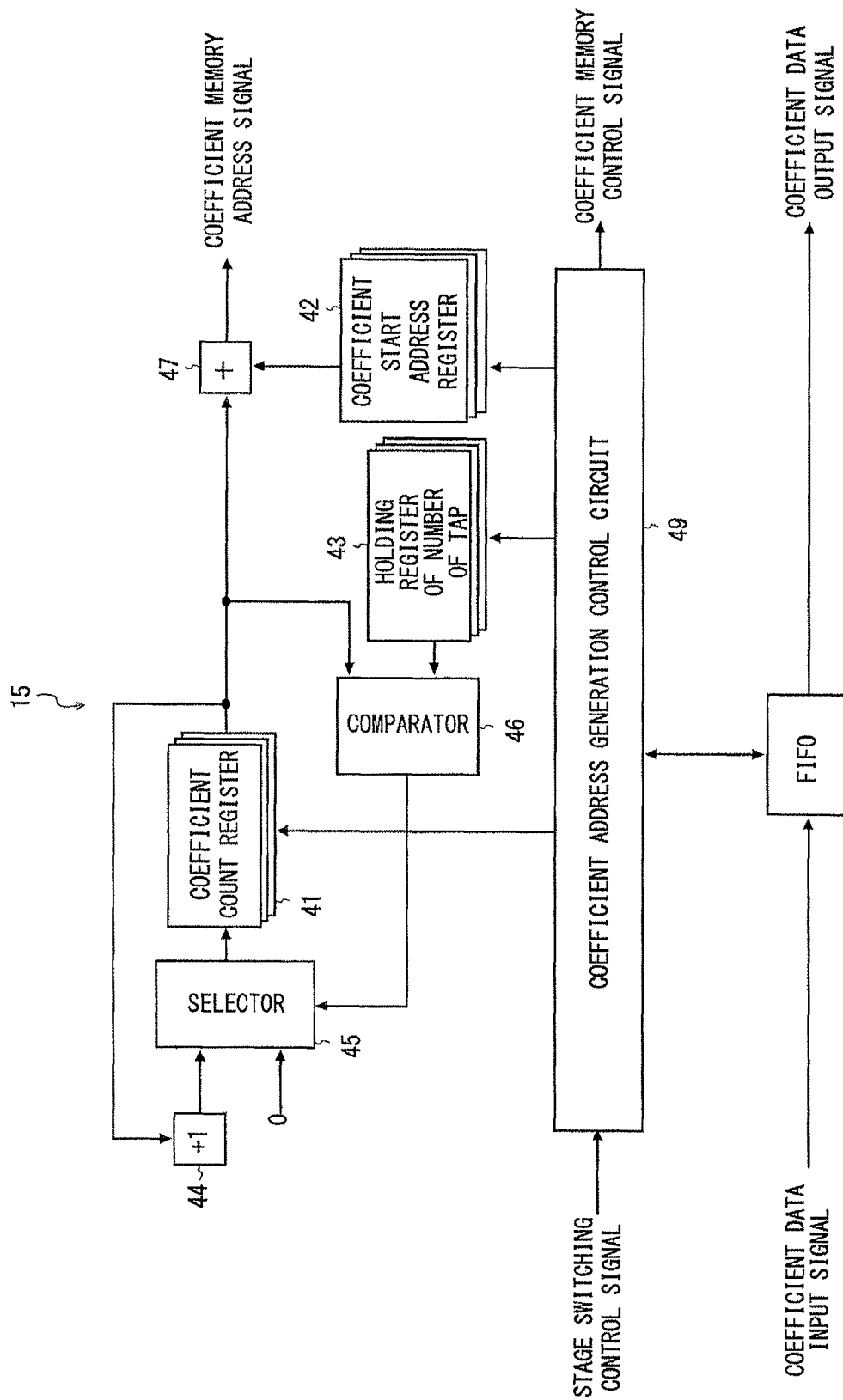
FIG. 4 illustrates an example of a concrete configuration of a coefficient memory read control circuit of the multi-stage filter processing device according to the first exemplary embodiment.

FIG. 4 shows an example of a concrete configuration of the coefficient memory read control circuit 15. The coefficient memory read control circuit 15 includes coefficient count registers 41, coefficient start address registers 42, holding registers of number of tap 43, an incrementer 44, a selector 45, a comparator 46, an accumulator 47, a coefficient address generation control circuit 49, a FIFO circuit 48, and the like.

A number of the coefficient count registers 41, a number of the coefficient start address registers 42 and a number of the holding registers of number of tap 43 are prepared which respectively correspond to the number of the stages of multi-stage filter processing. The registers 41, 42 and 43 which are subject to writing and reading are selected by the coefficient address generation control circuit 49.

The coefficient start address registers 42 store start addresses of the coefficient memory 14 for each of the stages. The holding registers of number of tap 43 store values from which one is subtracted from the number of taps corresponding to the regulated number of data for each stage. Coefficient memory address signals are generated by adding the values of coefficient count registers 41 and the values of the coefficient start address registers 42. Here, the number of taps is a number of times that one filter calculation processing is repeated. In general, the number of taps for one filter calculation processing corresponds to the regulated number of data. However, the regulated number of data is twice the number of taps when the FIR filter of the expression below, for example, is performed.

[Expression 1]

$$y_j = \sum_{i=0}^{N-1} c_i \cdot (x_{2i+j} + x_{2i+j+1}) \quad (1)$$

xi: input signal, yj: output signal, ci: filter coefficient, N: number of taps

First, upon writing zero into the coefficient count registers 41, address generation is started. Next, the incrementer 44 adds one to the values stored in the coefficient count registers 41 and then the results of the addition are stored in the coefficient count registers 41. The comparator 46 compares the values of the coefficient count registers 41 with the values of the holding registers of number of tap 43. When these values are in accord, zero is written into the coefficient count registers 41 again. According to this configuration, a ring buffer circulating within the address range set for each of the stages can be formed.

The coefficient data input signal read from the coefficient memory 14 is stored in the FIFO circuit 48 and output as a coefficient data output signal. The coefficient address generation control circuit 49 controls the generation of addresses so as to prevent the FIFO circuit 48 from overflowing.

Figure 5:
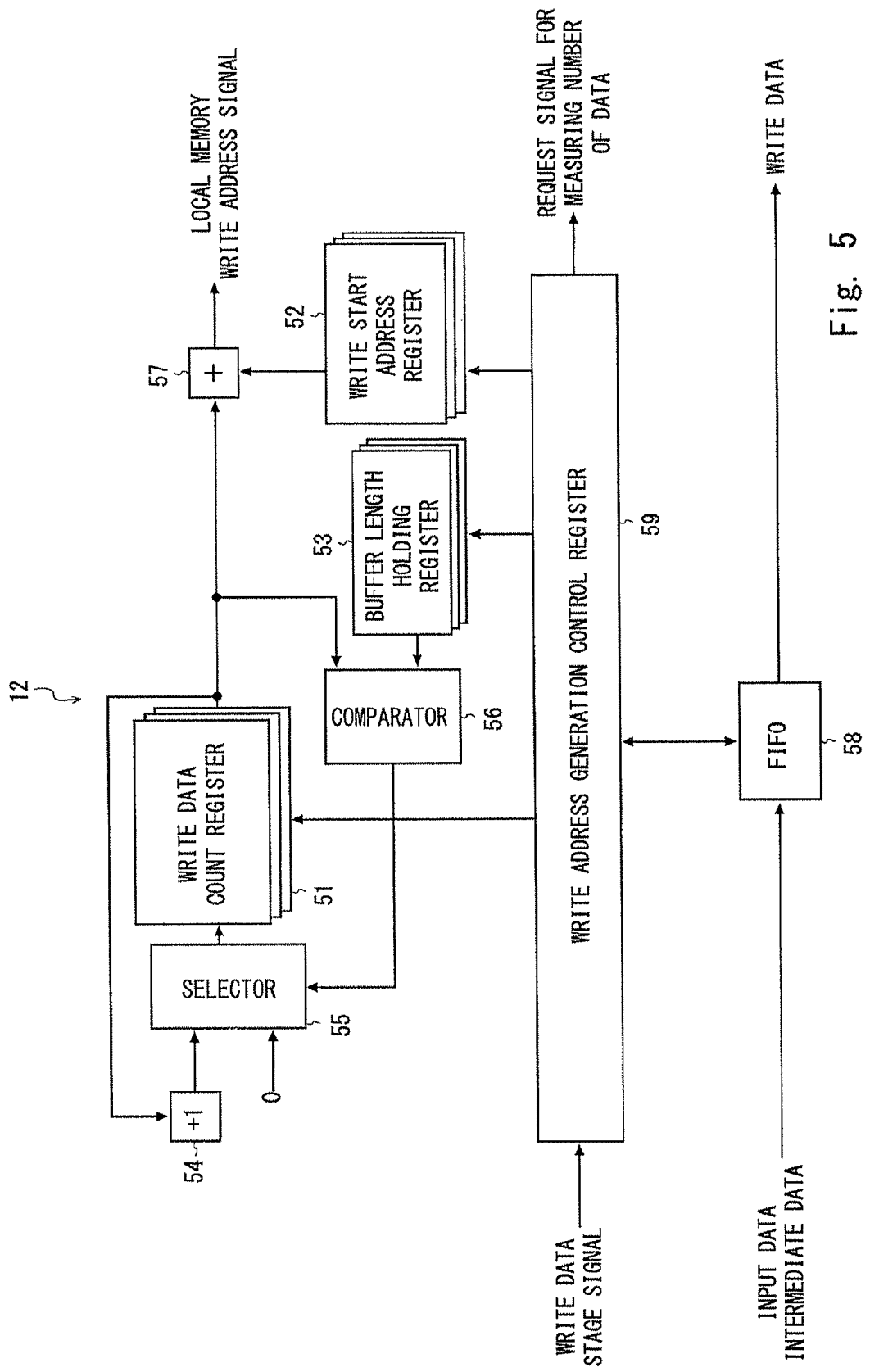
FIG. 5 illustrates an example of a concrete configuration of a local memory write control circuit of the multi-stage filter processing device according to the first exemplary embodiment.

FIG. 5 shows an example of a concrete configuration of the local memory write control circuit 12. The local memory write control circuit 12 includes write data count registers 51, write start address registers 52, buffer length holding registers 53, an incrementer 54, a selector 55, a comparator 56, an accumulator 57, a write address generation control circuit 59, a FIFO circuit 58, and the like.

A number of the write data count registers 51, a number of the write start address registers 52 and a number of the buffer length holding registers 53 are prepared which respectively correspond to the number of the stages of multi-stage filter processing. The registers 51, 52 and 53 which are subject to writing and reading are selected by the write address generation control circuit 59.

The write start address registers 52 store start addresses of the write memory for each of the stages. The buffer length holding registers 53 store values from which one is subtracted from the buffer lengths of the local memory for each of the stages.

The local memory write address signals are generated by adding the values of the write data count registers 51 and the values of the write start address registers 52.

First, the write data count registers 51 are set to zero and then address generation is started. Next, the incrementer 54 adds one to the values stored in the write data count registers 51 and then the results of the addition are stored in the write data count registers 51. The comparator 56 compares the values of the write data count registers 51 with the values of the buffer length holding registers 53. When these values are in accord, zero is written into the write data count registers 51 again. According to this configuration, a ring buffer circulating within the address range set for each of the stages can be formed.

The input data input output from the filter calculation processing circuit 2 or the intermediate data is stored in the FIFO circuit 58 and output to the local memory 11 in synchronization with the local memory write address signal. The write address generation control circuit 59 controls the generation of addresses so as to prevent the FIFO circuit 58 from overflowing.

Data read from the local memory 11 needs to be read in a repetitive manner, with the data to be read being shifted for each filter calculating. Therefore, the configuration of the local memory read control circuit 13 is a little more complicated than those of the coefficient memory read control circuit 15 and the local memory write control circuit 12.

Figures 7, 8:
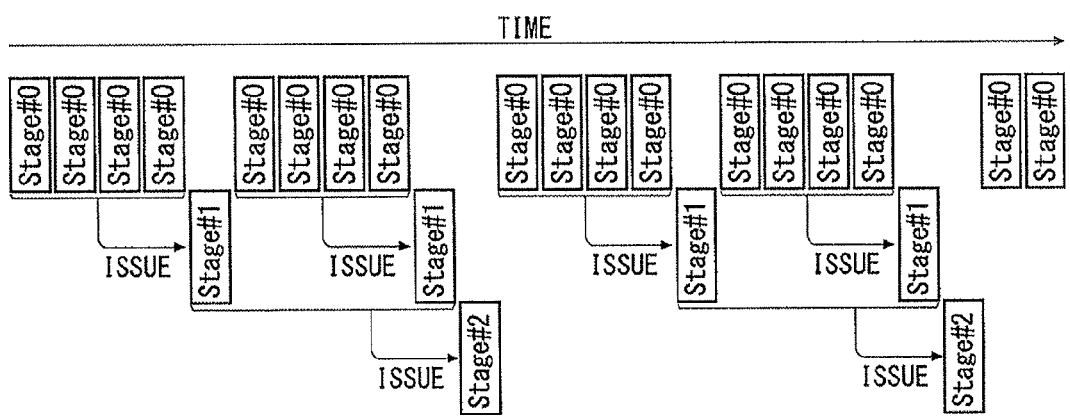
FIG. 7 illustrates an example of a local memory read address signal generated by the local memory read control circuit of the multi-stage filter processing device according to the first exemplary embodiment.
FIG. 8 illustrates an example of a flow of data in the multi-stage filter processing device according to the first exemplary embodiment.

FIG. 7 shows an example of local memory read address signals generated by the local memory read control circuit 13. Regarding the local memory read address signals according to the present exemplary embodiment, a decimation filter has ½ rate conversion factor, the regulated number of data is set to 12, and the buffer length of the local memory is set to 16. The buffer length of the local memory 11 has to be equal to or more than the regulated number of data.

In the first filter calculation processing, data of 0, 1, 2, 3, ~10, 11 stored in twelve addresses are read to perform the calculation. In the next filter calculation processing, read addresses are shifted by two due to a one-half rate conversion factor and data of 2, 3, 4, 5, ~12, 13 stored in twelve addresses are read to perform the calculation. In the next filter calculation processing, data of 4, 5, 6, 7, ~14, 15 are read, and after the next filter calculation processing, addresses remain after they are divided by 16 as the buffer length is 16 and data of 6, 7, 8, 9, ~15, 0, 1 are read.

Figure 6:
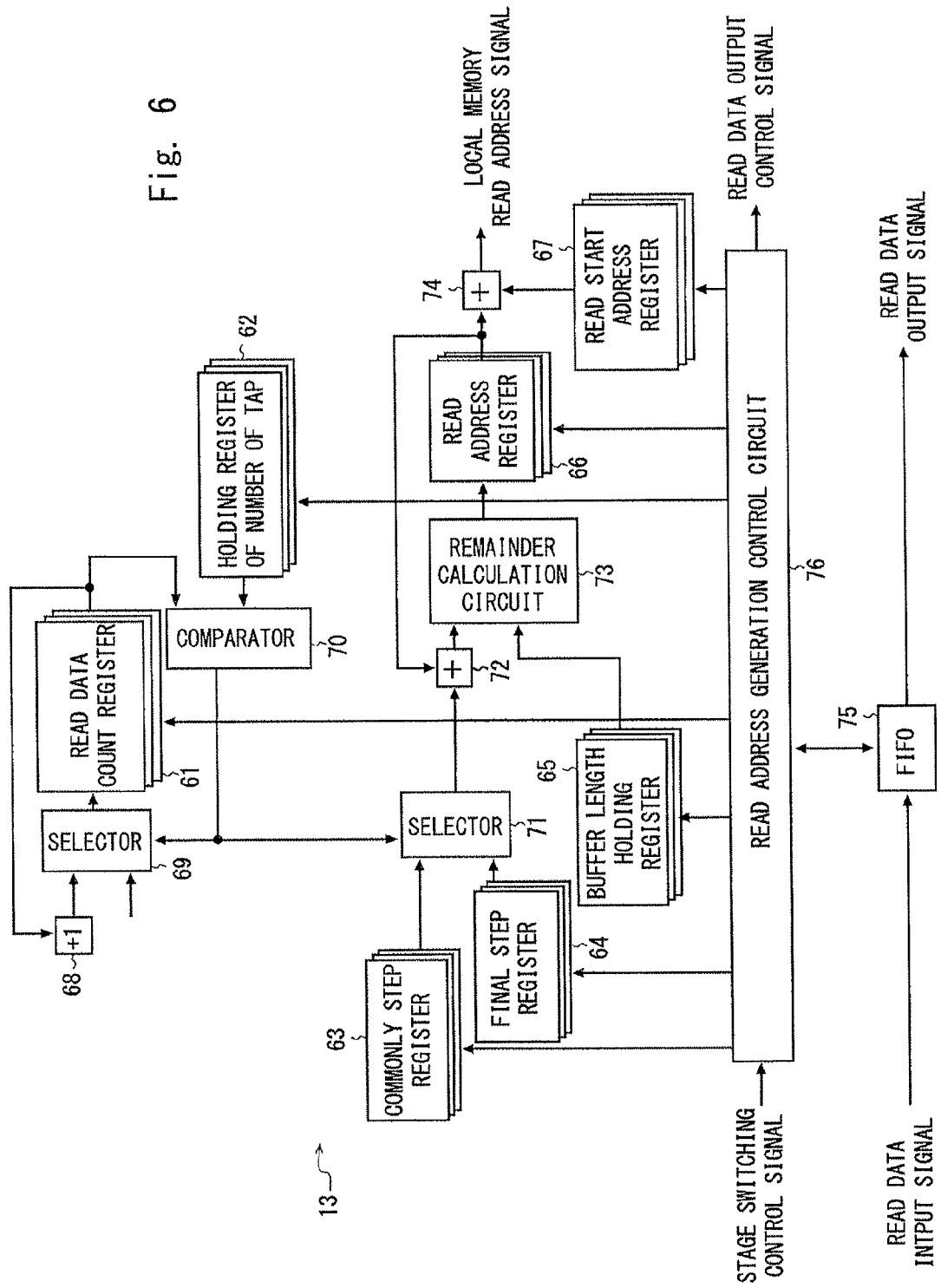
FIG. 6 illustrates an example of a concrete configuration of a local memory read control circuit of the multi-stage filter processing device according to the first exemplary embodiment.

FIG. 6 shows an example of a concrete configuration of the local memory read control circuit 13. The local memory read control circuit 13 includes read data count registers 61, holding registers of number of tap 62, common step registers 63, final step registers 64, buffer length holding registers 65, read address registers 66, read start address registers 67, an incrementer 68, selectors 69 and 71, a comparator 70, accumulators 72 and 74, a remainder calculation circuit 73, a FIFO circuit 75, a read address generation control circuit 76, and the like.

A number of read data count registers 61, a number of the holding registers of number of tap 62, a number of the common step registers 63, a number of the final step registers 64, a number of the buffer length holding registers 65, a number of the read address registers 66, and a number of the read start address registers 67 respectively corresponding to the number of the stages of multi-stage filter processing are prepared. The registers 61, 62, 63, 64, 65, 66 and 67 which are subject to writing and reading are selected by the read address generation control circuit 76.

The read start address registers 67 store start addresses of the read memory for each of the stages, such as zero in FIG. 7. The buffer length holding registers 65 store buffer lengths for filter calculation processing of each stage, such as 16 in FIG. 7. The holding registers of number of tap 62 store values from which one is subtracted from the number of taps corresponding to the regulated number of data of each stage, such as 11 in FIG. 7. The common step registers 63 store the difference in read addresses for normal time, such as one in FIG. 7. The final step registers 64 store values obtained by adding the buffer length to the difference in read addresses for an ending point of the filter processing and then calculating a remainder with the buffer length, such as seven in FIG. 7.

The local memory read address signals are generated by adding the values of the read address registers 66 and the values of the read start address registers 67.

First, the read data count registers 61 and the read address registers 66 are set to zero and then address generation is started. The read data count registers 61 and the read address registers 66 are updated at the same time.

The read data count registers 61 are incremented by the incrementer 68, and cleared by zero when the value of the read data count registers 61 accords with the value stored in the holding registers of number of tap 62. That is to say, they are counters that repeat the same value in a cycle of the tap number.

In general, the read address register 66 is updated by a result obtained by adding the value of the common step register 63 to the value of the read address register 66 and then calculating a remainder with the value of the buffer length holding register 65 by the remainder calculation circuit 73. However, the value of the final step register 64 is used without using the value of common step register 63 when the value of the read data count register 61 accords with the value of the holding register of number of tap 62.

By the above configuration, it is possible to generate addresses such as addresses circulated within an address range set for each of the stages and a value shifted for each filter calculation processing.

The read data read from the local memory 11 is stored in the FIFO circuit 75 and output to the filter calculation processing circuit 2. At this time, the generation of addresses is controlled so as to prevent the FIFO circuit 75 from overflowing.

Here is an example of the detailed operation of the multi-stage filter processing device 1. The filter calculation processing circuit 2 performs the FIR filter operation using the read data in series and the coefficient data, and the calculation result is stored in a number of the computational registers 21 corresponding to the stage number of the read data. The result of the FIR filter operation stored in the computational registers 21 and the input data or the intermediate data are mediated in an arbiter of the filter calculation processing circuit 2 so as to be output as the input data, the intermediate data or the output data. At this time, in the result of arbitration, when the input data is output as the input data without any change, the stage number is set to zero. On the other hand, when the value of the computational register is output as the intermediate data, the stage number is set to the value obtained by adding one to the stage number of the read data.

The local memory write control circuit 12 selects a parameter register corresponding to the stage number among the plurality of the parameter registers and stores the input data supplied from the filter calculation processing circuit 2 or the intermediate data in the local memory 11 according to the parameter value. At this time, data is stored cyclically within a certain number of address ranges of the local memory 11. At the same time, the local memory write control circuit 12 outputs the request signal for measuring the number of data in order to measure the number of data written into the local memory 11 to the measurement circuit of number of data 4.

The measurement circuit of number of data 4 measures, for each of the stages, the number of the input data or the intermediate data stored in the local memory 11. Then, the request signal for switching stages is output if it is detected that the number of data reaches the quantity needed to perform the filter calculation processing in the current stage.

The stage switching control circuit 6 outputs a stage switching control signal to the local memory read control circuit 13 and the coefficient memory read control circuit 15 upon receiving the request signal for switching stages.

The local memory read control circuit 13 reads the input data or the intermediate data from the local memory 11 in a continuous manner using a parameter corresponding to the stage number specified by the stage switching control signal and outputs these read data and the stage number to the filter calculation processing circuit 2.

The coefficient memory read control circuit 15 reads the coefficient data from the coefficient memory 14 in a continuous manner using the parameter corresponding to the stage number to output the read coefficient data to the filter calculation processing circuit 2.

Next, the overall flow of data will be illustrated by an example. The filter calculation processing is performed with regard to the input data of the stage zero first. The input data input into the multi-stage filter processing circuit device 1 is input to the local memory write control circuit 12 through the filter calculation processing circuit 2.

The local memory write control circuit 12 outputs the request signal for measuring the number of data for the stage zero in conjunction with writing the input data into the local memory 11 using the parameter for the stage zero.

The measurement circuit of number of data 4 increments the count register of number of data 31 for the stage zero and outputs the request signal for switching stages when the value to be incremented is equal to the predetermined number of data (the regulated number of data).

The stage switching control circuit 6 receives the request signal for switching stages and outputs the stage switching control signal for the stage zero to the local memory read control circuit 13 and the coefficient memory read control circuit 15.

The local memory read control circuit 13 reads data from the local memory 11 using the parameter register for the stage zero and outputs the read data to the filter calculation processing circuit 2. Concurrently with this, the local memory read control circuit 13 outputs zero as the stage number for read data.

The coefficient memory read control circuit 15 reads the coefficient data from the coefficient memory 14 using the parameter register for the stage zero to output the read coefficient data to the filter calculation processing circuit 2.

The filter calculation processing circuit 2 performs the FIR filter operation using the read data and the coefficient data which are input and stores the calculation result in the computational register 21 for the stage zero. After the FIR filter operation, the filter calculation processing circuit 2 outputs the calculation result as the intermediate data to the local memory write control circuit 12. Concurrently with this, value one is obtained by adding one to the current stage number.

The local memory write control circuit 12 outputs the request signal for measuring the number of data for the stage one in conjunction with writing the calculation result into the local memory 11 using the parameter for the stage one.

The measurement circuit of number of data 4 increments the count register of number of data 31 for the stage one and issues the request signal for switching stages when the value to be incremented is equal to the predetermined number of data (regulated number of data).

The stage switching control circuit 6 receives the request signal for switching stages and issues the stage switching control signal for the stage one to the local memory read control circuit 13 and the coefficient memory read control circuit 15.

The local memory read control circuit 13 reads data from the local memory 11 using the parameter register for the stage one and outputs the read data to the filter calculation processing circuit 2. Concurrently with this, the local memory read control circuit 13 outputs one as the stage number for read data.

The coefficient memory read control circuit 15 reads the coefficient data from the coefficient memory 14 using the parameter register for the stage one to output the read coefficient data to the filter calculation processing circuit 2.

The filter calculation processing circuit 2 performs the FIR filter operation using the read data and the coefficient data which are input and stores the calculation result in the computational register 21 for the stage one. After the FIR filter operation is finished, the filter calculation processing circuit 2 outputs the calculation result as the intermediate data to the local memory write control circuit 12. Concurrently with this, value two is obtained by adding one to the current stage number.

Afterwards, the FIR filter operation for each stage is performed by repeating a processing similar to the above-described one. When the FIR filter operation of the final stage is finished in the filter calculation processing circuit 2, the calculation result is output outside as the output data.

According to the above configuration, just a memory area of the local memory 11 for the only as needed filter calculation processing of the next stage has to remain. Therefore, the circuit size of the local memory 11 can be reduced to a minimum by mounting the local memory 11 so as to store cyclically the input data or the intermediate data in a given memory area.

FIG. 8 shows an example of a flow of data in the multi-stage filter processing device 1. In the present exemplary embodiment, the filter process for the stage one is performed when four calculation results of the stage zero are accumulated and the filter process for the stage two is performed when two calculation results of the stage one are accumulated.

According to this configuration and by storing data cyclically within a certain number of address ranges of the local memory 11, the amount of data stored in the local memory 11 can be minimized and the size of the local memory 11 can be minimized. Further, latency can be minimized rather than performing repetition processing such as performing filter processes for stage zero, one and two serially.

Figure 9:
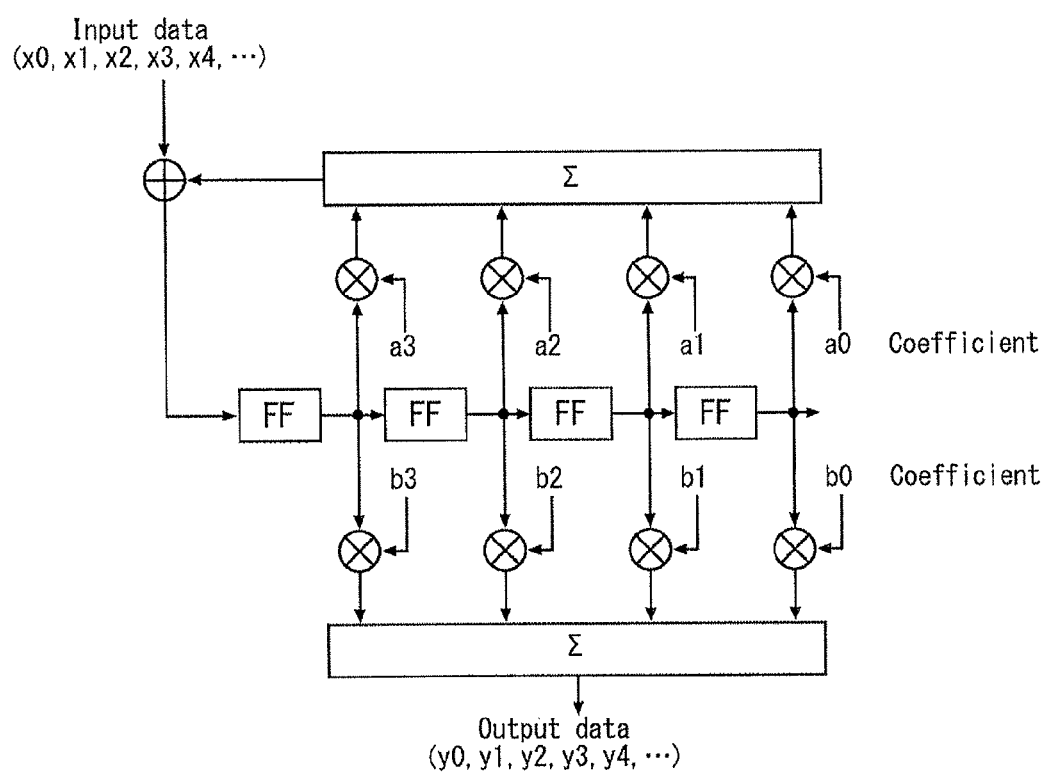
FIG. 9 illustrates an example of a common configuration of an IIR filter.
Figure 10:
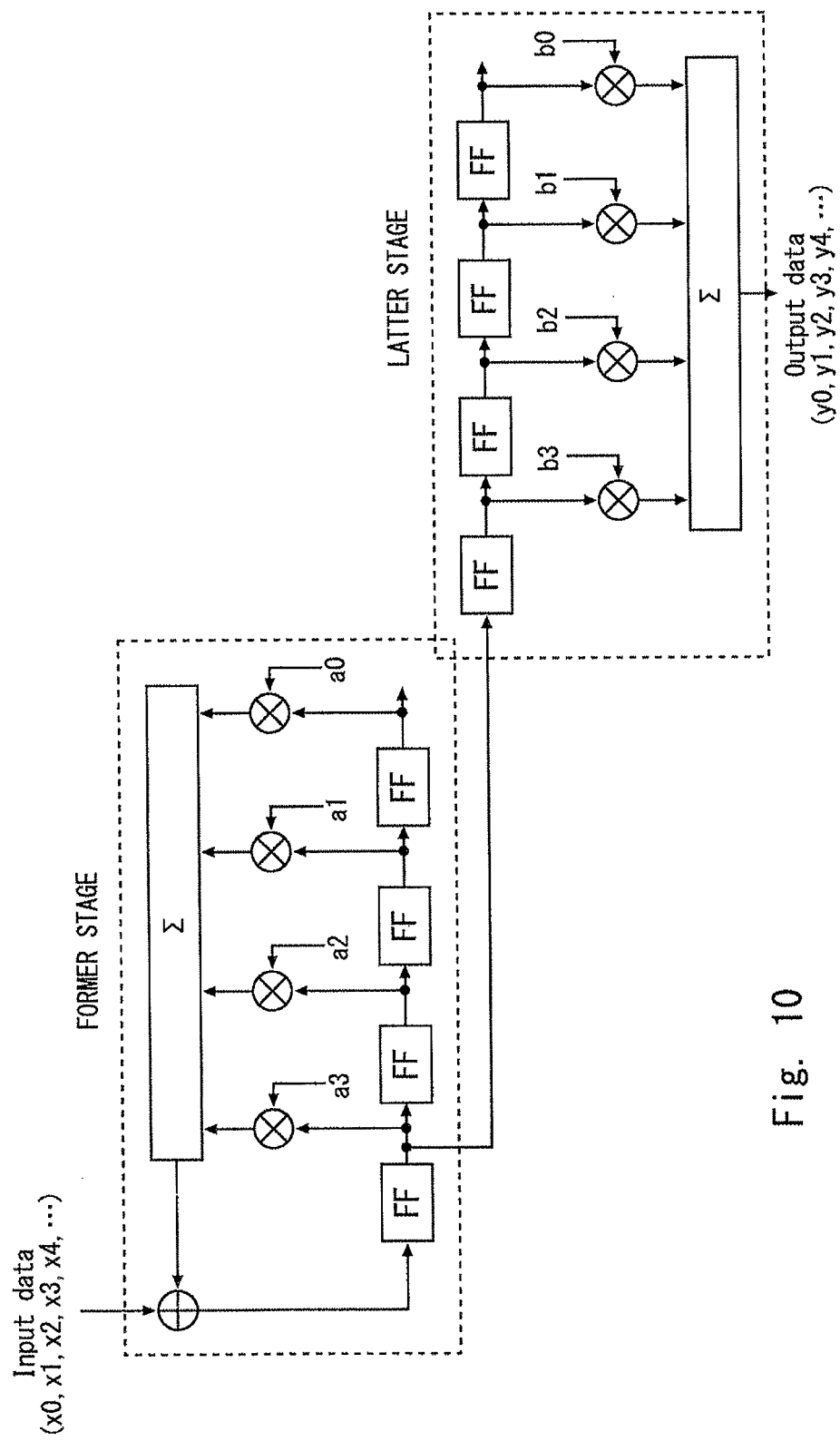
FIG. 10 illustrates an example of a common configuration of an IIR filter.

Additionally, another exemplary application makes IIR filter processing more efficient. FIGS. 9 and 10 show an example of a common configuration of an IIR filter. This processing of the IIR filter can be separated into processing of a former stage and that of a later stage to be a multi filter as shown in FIG. 10. Like this IIR filter which is different from the common FIR filter uses the calculation results for the next filter calculation processing. Therefore, when filter processes are performed by the pipeline processing, extra time is needed to perform the next filter calculation processing because latency occurs.

Figure 11:
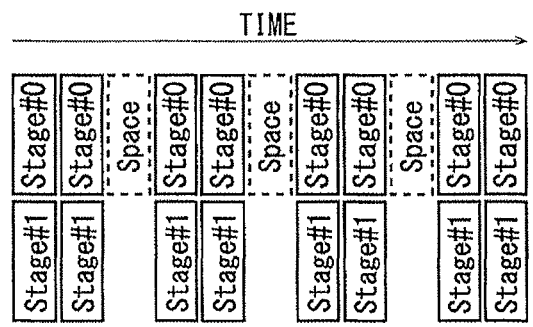
FIG. 11 illustrates an example of a flow of data in the IIR filter.
Figure 12:
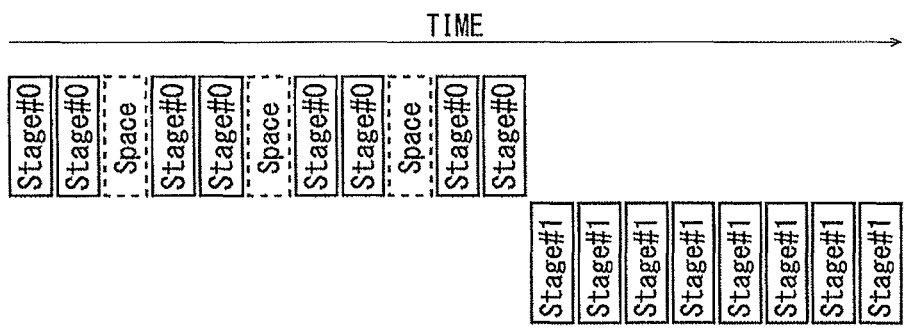
FIG. 12 illustrates an example of a flow of data in the IIR filter.

FIGS. 11 and 12 show an example of a flow of data in the IIR filter. FIG. 11 shows a case of an IIR filter having calculation circuits in both the former processing stage and the latter processing stage and performing calculations in parallel. FIG. 12 shows a case in which the IIR filter shares a calculation circuit at the former processing stage and the latter processing stage and performs calculations in serial. In these cases, a certain amount of spare time associated with the pipeline processing arises in the calculation processing of IIR filter and thus processing efficiency decreases.

Figure 13:
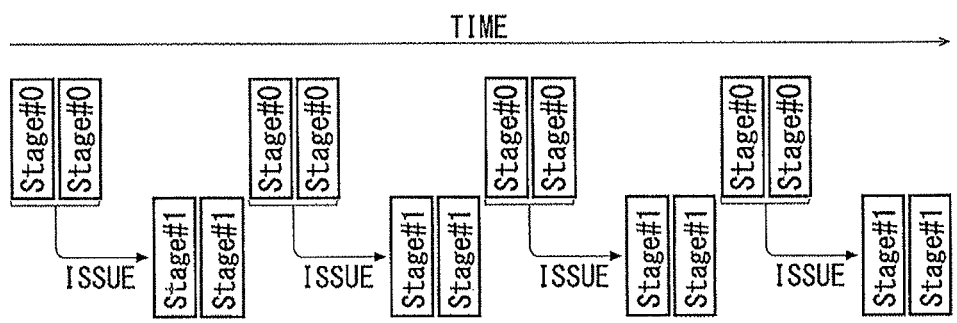
FIG. 13 illustrates an example of a flow of data in the IIR filter when the multi-stage filter processing device according to the first exemplary embodiment is used.
Figure 14:
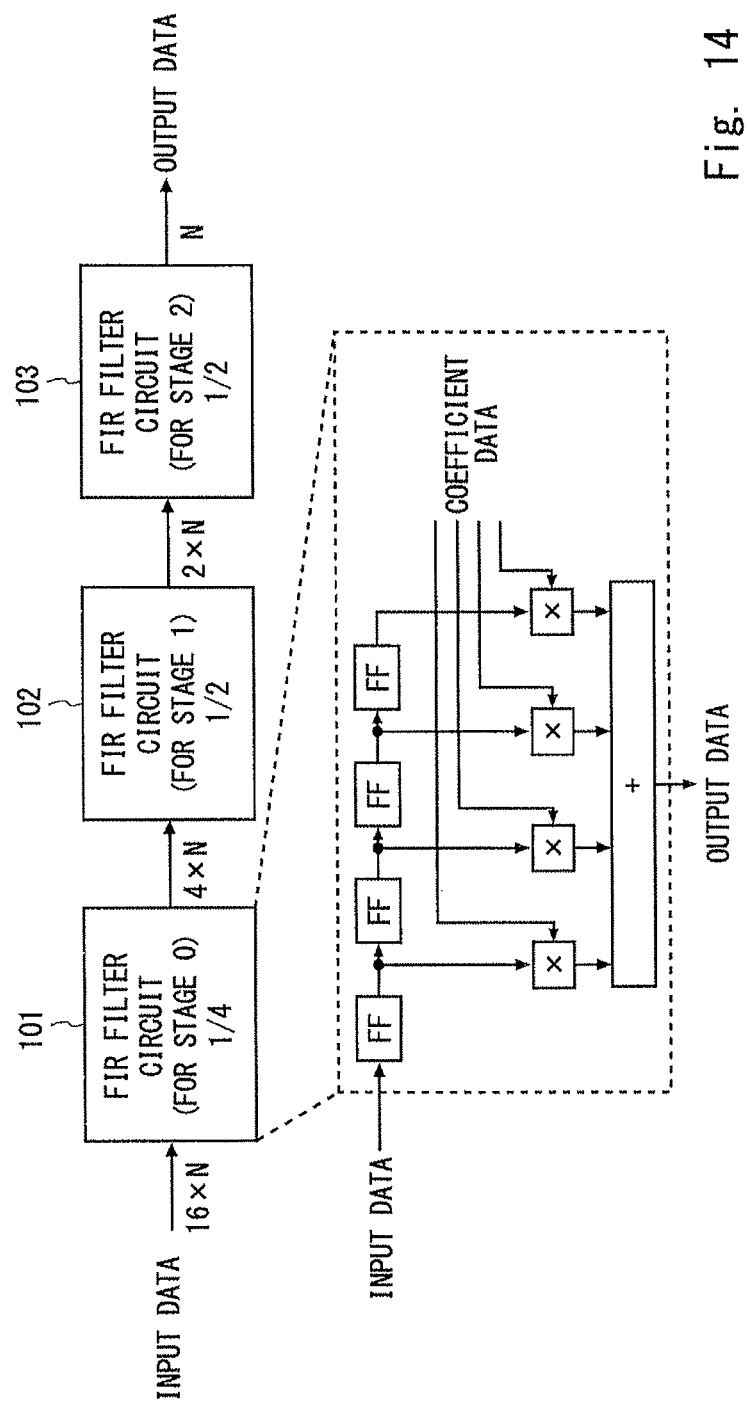
FIG. 14 shows a first exemplary implementation of a common multi-stage filter processing device.
Figure 15:
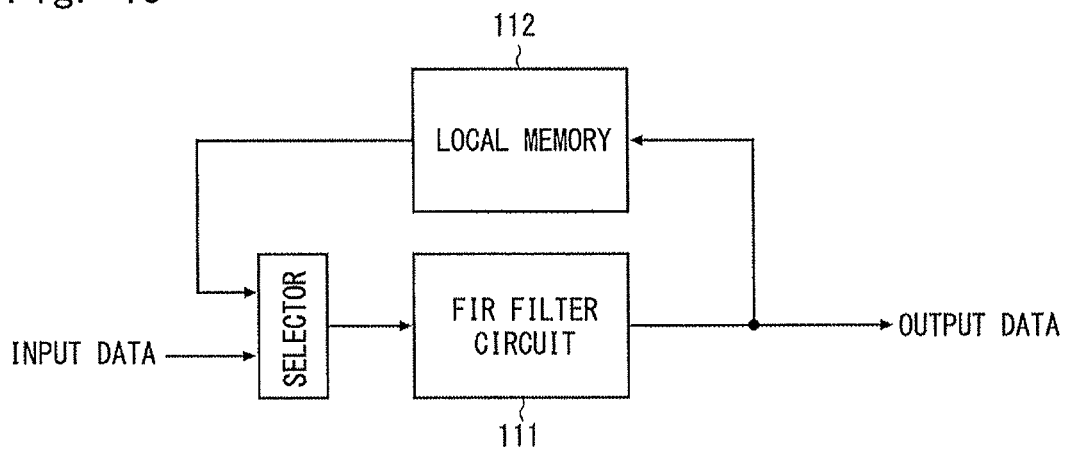
FIG. 15 shows a second exemplary implementation of a common multi-stage filter processing device.
Figure 16:
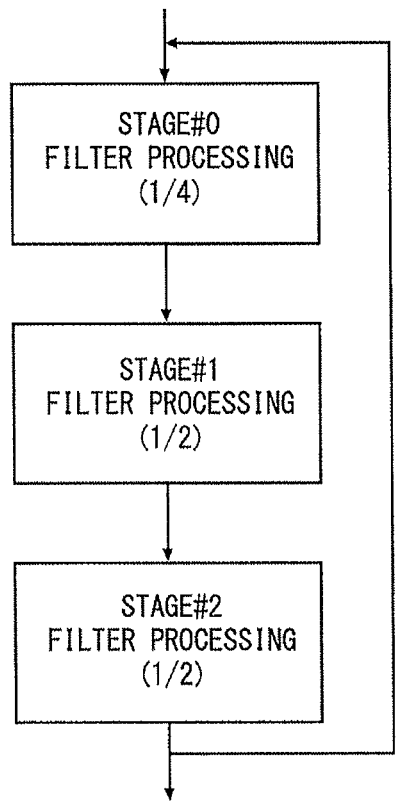
FIG. 16 shows a processing flow of the exemplary implementation shown in FIG. 15.

FIG. 13 shows an example of a flow of data in the IIR filter when the multi-stage filter processing device according to an exemplary embodiment is used. In this case, former stage processes of the IIR filter are performed and latter stage processes can be performed during its spare time. Thus, it is possible to avoid a decrease in processing efficiency. Therefore, the exemplary embodiment can increase the efficiency of the multi-stage filter processing as well as reduce a circuit size, scale-down the memory area, or the like.

Also, the invention is not limited to these embodiments and various changes may be made therein without departing from the spirit of the present invention.

While the invention has been particularly shown and described with reference to exemplary embodiments thereof, the invention is not limited to these embodiments. It will be understood by those of ordinary skill in the art that various changes in form and details may be made therein without departing from the scope of the present invention as defined by the claims.

This application is based upon and claims the benefit of priority from Japanese patent application No. 2012-131270, filed on Jun. 8, 2012, the disclosure of which is incorporated herein in its entirety by reference.

REFERENCE SIGNS LIST

1 MULTI-STAGE FILTER PROCESSING DEVICE
2 FILTER CALCULATION PROCESSING CIRCUIT
3 PROCESSING DATA HOLDING CIRCUIT
4 MEASUREMENT CIRCUIT OF NUMBER OF DATA
5 COEFFICIENT DATA HOLDING CIRCUIT

6 STAGE SWITCHING CONTROL CIRCUIT
11 LOCAL MEMORY
12 LOCAL MEMORY WRITE CONTROL CIRCUIT
13 LOCAL MEMORY READ CONTROL CIRCUIT
14 COEFFICIENT MEMORY
15 COEFFICIENT MEMORY READ CONTROL CIRCUIT
21 COMPUTATIONAL REGISTER
22 MULTIPLIER
23, 33, 47, 57, 72, 74 ACCUMULATORS
24, 25, 27, 34, 45, 55, 69, 71 SELECTORS
26, 44, 54, 68 INCREMENTERS
28 FILTER CALCULATION CONTROL CIRCUIT
31 COUNT REGISTER OF NUMBER OF DATA
32 HOLDING REGISTER OF NUMBER OF REPEAT
35, 46, 56, 70 COMPARATORS
36 MEASUREMENT CONTROL CIRCUIT OF NUMBER OF DATA
41 COEFFICIENT COUNT REGISTER
42 COEFFICIENT START ADDRESS REGISTER
43 HOLDING REGISTER OF NUMBER OF TAP
48, 58, 75 FIFO
49 COEFFICIENT ADDRESS GENERATION CONTROL CIRCUIT
51 WRITE DATA COUNT REGISTER
52 WRITE START ADDRESS REGISTER
53 BUFFER LENGTH HOLDING REGISTER
59 WRITE ADDRESS GENERATION CONTROL REGISTER
61 READ DATA COUNT REGISTER
62 HOLDING REGISTER OF NUMBER OF TAP
63 COMMONLY STEP REGISTER
64 FINAL STEP REGISTER
65 BUFFER LENGTH HOLDING REGISTER
66 READ ADDRESS REGISTER
67 READ START ADDRESS REGISTER
73 REMAINDER CALCULATION CIRCUIT
76 READ ADDRESS GENERATION CONTROL CIRCUIT

The invention claimed is:

1. A multi-stage filter processing device that performs filter calculation processing composed of a plurality of stages on input data to generate output data, the multi-stage filter processing device comprising:
    a filter calculation unit that performs the filter calculation processing for each stage;
    a processing data holding unit that holds the input data or intermediate data generated by the filter calculation unit during the stages before a final stage is reached;
    a measurement unit of number of data that measures, at each of the stages, a number of data of the input data or the intermediate data;
    a coefficient data holding unit that holds a coefficient data regulating a number of data sufficient to perform the filter calculation for each of the stages; and
    a stage switching control unit that controls switching of the stages in the filter calculation processing, the stage switching control unit,
    making the processing data holding unit hold the input data or the intermediate data generated in a current stage until the number of data reaches a data quantity sufficient to perform the filter calculation processing in the current stage on the basis of the coefficient data,
    inputting all of the input data or all of the intermediate data held by the processing data holding unit to the filter calculation unit when the number of data reaches the data quantity sufficient to perform the filter calculation processing; and
    making the filter calculation unit perform the filter calculation processing of the current stage,
    wherein the filter calculation unit comprises registers for all of the stages, stores a result of a product-sum operation for the input data or the intermediate data read from the processing data holding unit and the coefficient data, in the registers corresponding to the current stage, selects one of the input data and data stored in the registers using an arbiter, and outputs selected data and data indicating the current stage.

2. A multi-stage filter processing device according to claim 1, wherein the processing data holding unit stores the input data or the intermediate data on a given physical memory area in such a way that the data circulates in a given cycle.

3. A multi-stage filter processing device according to claim 2, wherein the processing data holding unit comprises:
    a local memory that stores the input data or the intermediate data;
    a local memory write control unit that generates, at each of the stages, an address signal specifying a memory area of the local memory and circulating at the given circle and stores the input data or the intermediate data in the local memory on the basis of the address signal; and
    a local memory read control unit that reads the input data or the intermediate data that has been stored in the memory area specified by the address signal corresponding to the current stage to supply the filter calculation unit.

4. A multi-stage filter processing device according to claim 2, wherein the coefficient data holding unit comprises:
    a coefficient memory that stores the coefficient data;
    a coefficient memory read control unit that reads coefficient data corresponding to the current stage and supplies the filter calculation unit with the coefficient data.

5. A multi-stage filter processing device according to claim 3, wherein the coefficient data holding unit comprises:
    a coefficient memory that stores the coefficient data;
    a coefficient memory read control unit that reads coefficient data corresponding to the current stage and supplies the filter calculation unit with the coefficient data.

6. A multi-stage filter processing device according to claim 1, wherein the coefficient data holding unit comprises:
    a coefficient memory that stores the coefficient data;
    a coefficient memory read control unit that reads coefficient data corresponding to the current stage and supplies the filter calculation unit with the coefficient data.

* * * * *